(12) United States Patent
Nakagawa et al.

(10) Patent No.: US 7,577,406 B2
(45) Date of Patent: Aug. 18, 2009

(54) WIRELESS TRANSCEIVER FOR AUTOMOTIVE VEHICLE

(75) Inventors: Mitsuru Nakagawa, Chiryu (JP); Terutaka Maruyama, Toyota (JP)

(73) Assignee: DENSO CORPORATION, Kariya (JP)

( * ) Notice: Subject to any disclaimer, the term of this patent is extended or adjusted under 35 U.S.C. 154(b) by 281 days.

(21) Appl. No.: 11/004,979

(22) Filed: Dec. 7, 2004

(65) Prior Publication Data

US 2005/0136852 A1    Jun. 23, 2005

(30) Foreign Application Priority Data

Dec. 17, 2003    (JP)    ............................. 2003-419565

(51) Int. Cl.
*H04B 1/38*    (2006.01)

(52) U.S. Cl. ................... 455/90.3; 455/558; 70/256; 70/456; 235/492

(58) Field of Classification Search ............... 455/90.3, 455/558; 70/256, 456; 235/492
See application file for complete search history.

(56) References Cited

U.S. PATENT DOCUMENTS

| | | | | |
|---|---|---|---|---|
| 5,046,343 A * | 9/1991 | Miwa | ............................. | 70/408 |
| 5,521,433 A | 5/1996 | Hirata et al. | | |
| 5,727,408 A | 3/1998 | Mizuno et al. | | |
| 5,735,040 A * | 4/1998 | Ochi et al. | ..................... | 29/841 |
| 5,768,925 A * | 6/1998 | Ozawa et al. | ................. | 70/408 |
| 5,822,192 A * | 10/1998 | Hayashi | ...................... | 361/752 |
| 5,952,713 A * | 9/1999 | Takahira et al. | ............. | 257/679 |
| 5,993,248 A * | 11/1999 | Bethurum | ................... | 439/500 |
| 6,016,676 A * | 1/2000 | McConnell | .................. | 70/408 |
| 6,050,118 A * | 4/2000 | Kito | ........................ | 70/456 R |
| 6,386,447 B1 * | 5/2002 | Proefke et al. | .............. | 235/380 |
| 6,433,728 B1 * | 8/2002 | Krupp et al. | ................ | 341/176 |
| 6,460,386 B1 * | 10/2002 | Watanuki et al. | .......... | 70/456 R |
| 6,462,291 B1 * | 10/2002 | Sachs | ...................... | 200/302.2 |
| 6,474,123 B1 * | 11/2002 | Kito et al. | ................. | 70/456 R |
| 6,691,539 B2 * | 2/2004 | Jacob et al. | ................... | 70/408 |
| 6,765,311 B1 * | 7/2004 | Labonde | .................... | 307/10.1 |
| 6,822,420 B2 * | 11/2004 | Kozu et al. | .................. | 320/107 |
| 7,142,413 B2 * | 11/2006 | Sugimoto et al. | ........... | 361/679 |

(Continued)

FOREIGN PATENT DOCUMENTS

CN    2511754 Y    9/2002

(Continued)

OTHER PUBLICATIONS

Decision for Refusal from Korean Patent Office issued on Feb. 28, 2007 for the corresponding Korean patent application No. 10-2004-106709.

(Continued)

*Primary Examiner*—Matthew D Anderson
*Assistant Examiner*—April S Guzman
(74) *Attorney, Agent, or Firm*—Posz Law Group, PLC

(57) ABSTRACT

A wireless transceiver for a keyless entry system of an automotive vehicle includes: a circuit board having a circuit part disposed thereon; and a resin mold for molding the circuit board. The resin mold molds both of the circuit board and the circuit part, and the resin mold has a card shape. The resin mold has no connection portion of a casing so that the transceiver has high water resistance and high impact resistance.

18 Claims, 9 Drawing Sheets

U.S. PATENT DOCUMENTS

| | | | |
|---|---|---|---|
| 7,156,301 B1* | 1/2007 | Bonalle et al. | 235/380 |
| 7,166,812 B2* | 1/2007 | White et al. | 200/341 |
| 7,217,153 B2* | 5/2007 | Sugimoto et al. | 439/500 |
| 2003/0006879 A1 | 1/2003 | Kang et al. | |
| 2003/0173709 A1 | 9/2003 | Iwaizono et al. | |
| 2004/0055783 A1* | 3/2004 | Masuda | 174/252 |
| 2004/0085251 A1* | 5/2004 | Shimura | 343/872 |
| 2004/0099430 A1* | 5/2004 | Scudder | 174/52.3 |
| 2004/0099746 A1* | 5/2004 | Norton | 235/492 |
| 2004/0145450 A1* | 7/2004 | Katagiri et al. | 340/5.72 |
| 2005/0143029 A1* | 6/2005 | Sasaki et al. | 455/128 |
| 2006/0044313 A1 | 3/2006 | Lake et al. | |
| 2006/0221073 A1 | 10/2006 | Teler et al. | |

FOREIGN PATENT DOCUMENTS

| | | |
|---|---|---|
| JP | U-S60-57234 | 4/1985 |
| JP | U-S62-31660 | 2/1987 |
| JP | U-H03-101819 | 10/1991 |
| JP | A-07-236181 | 9/1995 |
| JP | A-H10-169264 | 6/1998 |
| JP | A-11-280313 | 10/1999 |
| JP | A-2002-339605 | 11/2002 |
| JP | A-2003-150995 | 5/2003 |

OTHER PUBLICATIONS

First Office Action from Chinese Patent Office issued on May 19, 2006 for the corresponding Chinese patent application No. 200410081821.9.

Notice of Invitation to Submit Opinion from Korean Patent Office issued on May 27, 2006 for the corresponding Korean patent application No. 10-2004-0106709.

Decision for Refusal from Japanese Patent Office issued on Feb. 28, 2007 for the corresponding Japanese patent application No. 10-2004-106709.

Notice of Reason for Refusal issued from the Japanese Patent Office mailed on Apr. 21, 2009 in the corresponding Japanese patent application No. 2003-419565 (with English translation thereof).

* cited by examiner

WIRELESS TRANSCEIVER FOR AUTOMOTIVE VEHICLE

CROSS REFERENCE TO RELATED APPLICATION

This application is based on Japanese Patent Application No. 2003-419565 filed on Dec. 17, 2003, the disclosure of which is incorporated herein by reference.

FIELD OF THE INVENTION

The present invention relates to a wireless transceiver suitably used for an automotive vehicle.

BACKGROUND OF THE INVENTION

A wireless transceiver for an automotive vehicle is, for example, used for a keyless entry system. The transceiver as a portable key is made of, for example, a thin plate such as card key. This is because it is required for the transceiver to reduce dimensions of the transceiver and to handle easily.

Since the transceiver is portable with a user, the transceiver is required to have impact resistance and water resistance.

If the transceiver has a hole or a clearance, water may penetrate into the transceiver through the clearance or the through hole. Therefore, the transceiver may be damaged.

Further, when the user of the transceiver drops the transceiver, a contact portion between an electronic part and a circuit board in the transceiver may be cracked by an impact. In this case, the circuit board may bend with the impact because the circuit board is thin. At this time, the electric part mounted on the circuit board may not follow the bending of the circuit board, so that a stress is applied to the circuit part. Thus, the circuit part may be damaged. Further, the stress is applied to the connection portion between the circuit board and the electronic part so that the connection portion may be cracked.

SUMMARY OF THE INVENTION

In view of the above-described problem, it is an object of the present invention to provide a wireless transceiver having high water resistance and high impact resistance.

A wireless transceiver for a keyless entry system of an automotive vehicle includes: a circuit board having a circuit part disposed thereon; and a resin mold for molding the circuit board. The resin mold covers both of the circuit board and the circuit part. The resin mold has a card shape.

The resin mold has no connection portion of a casing so that the transceiver has high water resistance and high impact resistance.

Preferably, the resin mold is provided by one integral body so that no hole is disposed on a surface of the resin mold except for a battery inlet.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 11A:
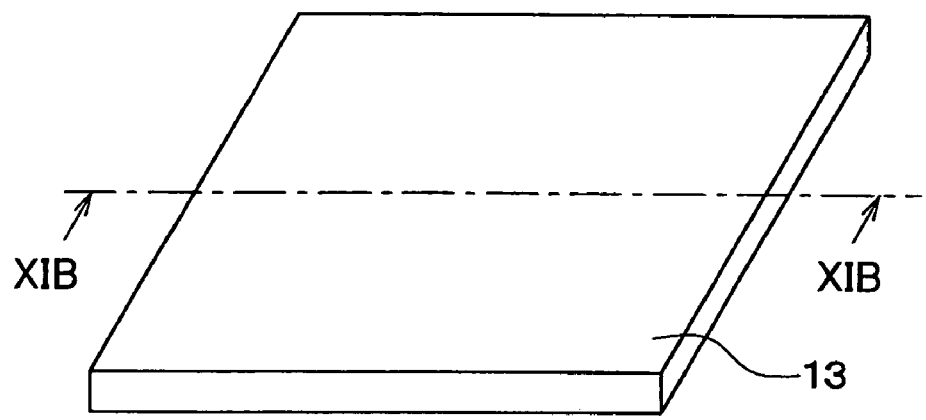
FIG. 11A is a perspective view showing a transceiver according to a comparison of the first embodiment.
Figure 11B:
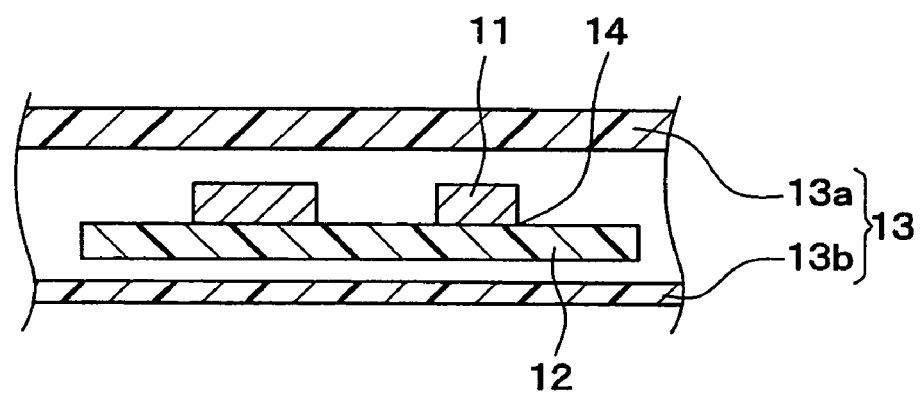
FIG. 11B is a cross sectional view showing the transceiver taken along line XIB-XIB in FIG. 11A.

The inventors have preliminarily studied about a card type transceiver shown in FIGS. 11A and 11B. The transceiver includes a circuit board 12 and a casing 13, which is composed of an upper casing 13a and a lower casing 13b. A circuit part 11 such as an IC chip is mounted on the circuit board 12. The circuit board 12 is sandwiched between the upper and lower casings 13a, 13b so that the circuit board 12 is packaged. The transceiver has a space disposed between the circuit part 11 and the upper casing 13a so that the transceiver has a hollow construction.

In the above transceiver, if a clearance or a through hole is generated between the upper casing 13a and the lower casing 13b, water may penetrate into the transceiver through the clearance or the through hole. Thus, the transceiver may be damaged.

Since the transceiver has the hollow construction, when a user of the transceiver drops the transceiver, a contact portion 14 between the circuit board 12 and the circuit part 11 may be cracked by an impact. In this case, the circuit board 12 may bend with the impact because the circuit board 12 is thin. At this time, the circuit part 11 mounted on the circuit board 12 may not follow the bending of the circuit board 12, so that a stress is applied to the circuit part 11. Thus, the circuit part 11 maybe damaged. Further, the stress is applied to the connection portion 14 between the circuit board 12 and the circuit part 11 so that the connection portion 14 may be cracked.

In view of the above problem, a transceiver according to a first embodiment of the present invention is provided. The transceiver is suitably used for a keyless entry system of an automotive vehicle. Specifically, the transceiver transmits and receives an electromagnetic wave so that a user of the transceiver can enter the vehicle without using a key mechanically. Thus, the transceiver is used as a portable key.

Figure 1A:
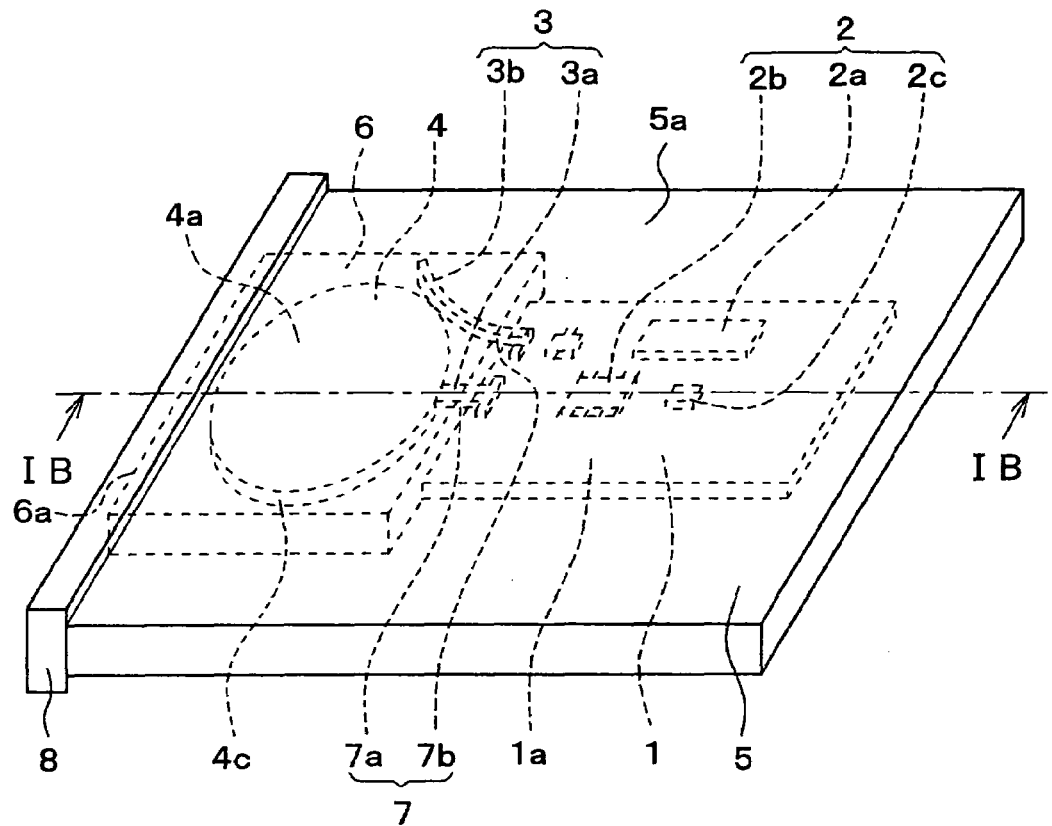
FIG. 1A is a perspective view showing a transceiver according to a first embodiment of the present invention.
Figure 1B:
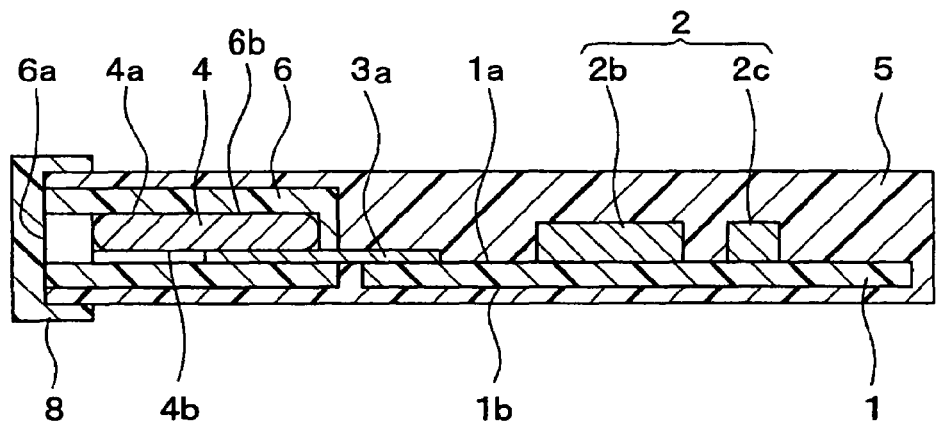
FIG. 1B is a cross sectional view showing the transceiver taken along line IB-IB in FIG. 1A.

The transceiver is shown in FIGS. 1A and 1B. The transceiver includes a circuit board 1, a circuit part 2 as an electric device, a terminal portion 3, a battery 4 as a power source, and a resin mold 5 for molding the transceiver. The circuit board 1 is made of a printed circuit board or a flexible printed circuit board. The circuit part 2 is mounted on the circuit board 1.

The circuit part 2 receives a request signal from an external circuit of an automotive vehicle, and transmits a response signal to the external circuit. Here, the request signal outputted from the external circuit is an identity code request signal for requesting the identity code memorized in the transceiver. The transceiver transmits the identity code as the response signal to the external circuit.

The circuit part 2 includes an antenna 2a, an IC package 2b, X and an electric part 2c. In FIG. 1B, the circuit part 2 is mounted on a principal surface 1a of the circuit board 1. However, the circuit part 2 can be mounted on a backside 1b of the circuit board 1.

The battery 4 is inserted into a battery holder 6. The battery holder 6 accommodates the battery 4, and is disposed next to the circuit board 1. The battery 4 has a foreside surface 4a and a backside surface 4b, which is opposite to the foreside surface 4a. The battery 4 has a side surface 4c connecting to the foreside and backside surfaces 4a, 4b. The battery 4 has a plate shape. For example, the battery 4 is a button battery having a disk shape. The battery holder 6 has also a plate shape. The battery holder 6 has a rectangular body with an opening for accommodating the battery 4. Specifically, the battery holder 6 includes an inlet port 7, which is composed of two inlets 7a, 7b for inserting the terminal portion 3 into the inlets 7a, 7b. The terminal portion 3 is composed of first and second terminals 3a, 3b so that each terminal 3a, 3b can insert into the inlet 7a, 7b, respectively. The second terminal 3b is disposed on outside of the side surface of the battery 4 to contact the side surface 4c of the battery 4, and the first terminal 3a is disposed under the battery 4 to contact the backside 4b surface of the battery 4. Thus, the circuit part 2 connects to the battery 4 through the terminals 3a, 3b. The terminals 3a, 3b are disposed on a battery side of the circuit board 1.

The terminals 3a, 3b are made of electrically conductive material having elasticity. The terminals 3a, 3b extend from the circuit part 2 to the battery 4. Specifically, the first terminal 3a has a thin and long plate shape, and has a principal surface in parallel with the principal surface 1a of the circuit board 1 and the foreside and backside surfaces 4a, 4b of the battery 4. The second terminal 4b has a long plate shape with a principal surface, which is perpendicular to the principal surface 1a of the circuit board 1 and parallel to the side surface 4c of the battery 4. The second terminal 3b further includes a side surface, which is parallel to the principal surface 1a of the circuit board 1 and fixed to the circuit board 1. The second terminal 3b is, for example, formed by a bending method.

Figure 2A:
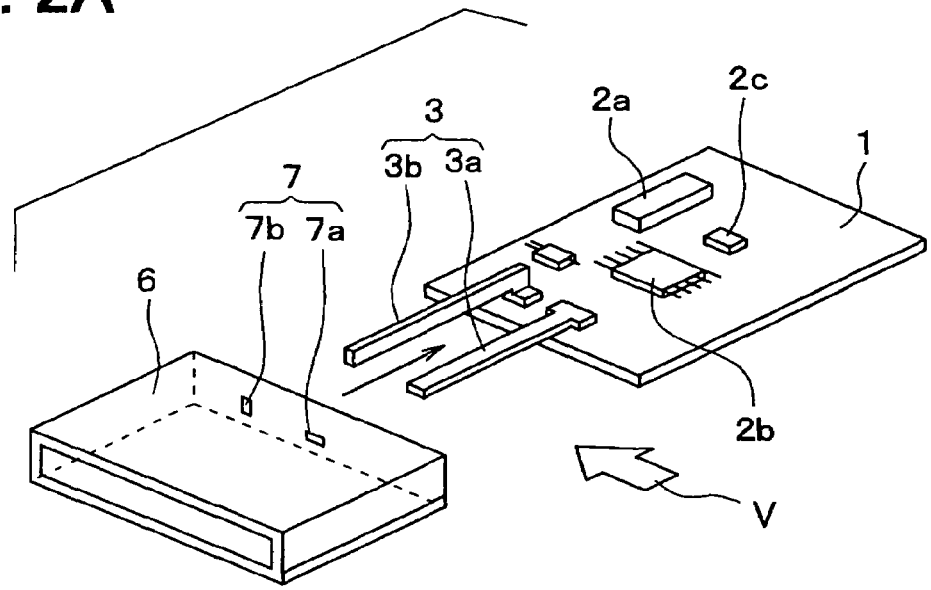
FIGS. 2A and 2B are perspective views explaining a method for manufacturing the transceiver according to the first embodiment.

The distance between two terminals 3a, 3b is smaller than a diameter of the battery 4. As shown in FIG. 2A, before the battery 4 is inserted into the battery holder 6, the second terminal 3b has a linear shape. When the battery 4 is inserted into the battery holder 6, the second terminal 3b is pushed and bent by the battery 4. Thus, the principal surface of the second terminal 3b contacts the side surface 4c of the battery 4. Further, the principal surface of the first terminal 3a contacts the backside surface 4b of the battery 4. In the transceiver, the battery 4 is inserted into the battery holder 6 so that the first and second terminals 3a, 3b contact the battery 4 electrically. Here, after the battery 4 is inserted into the battery holder 6, the battery holder 6 is covered with a battery cover 8.

Although the principal surface of the second terminal 3b contacts the side surface 4c of the battery 4, the principal surface of the second terminal 3b can contact the principal surface 4a of the battery 4. In this case, the total thickness of the transceiver is composed of the thicknesses of the first and second terminals 3a, 3b in addition to the thickness of the battery 4 so that the transceiver becomes thicker. Therefore, in FIG. 2, the second terminal 3b contacts the side surface 4b of the battery 4 so that the total thickness of the transceiver does not include the thickness of the terminal 3b. Thus, the transceiver becomes thinner.

The resin mold 5 has a card type package with a predetermined thickness. Specifically, the resin mold 5 has a thin rectangular plate shape. The resin mold 5 has a thickness equal to or thinner than 5 mm. In FIG. 1B, the transceiver having the resin mold 5 and the battery cover 8 has an outline dimensions of 86 mm.times.54 mm.times.3 mm. That is, the thickness of the transceiver is 3 mm, the length is 86 mm, and the width is 54 mm.

Figure 3:
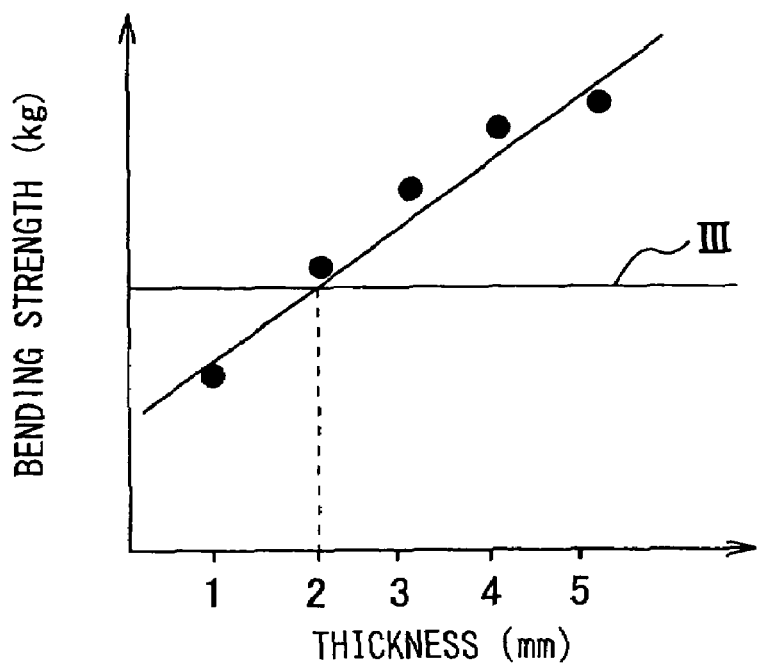
FIG. 3 is a graph showing a relationship between a thickness of the transceiver and a bonding strength of the transceiver according to the first embodiment.

The thickness of the transceiver is determined as follows. The transceiver is tested by a bending strength test. FIG. 3 shows a relationship between the thickness of the transceiver and a bending strength of the transceiver. Here, the transceiver as a key of the vehicle is usually put in a pocket of trousers of a user of the vehicle. It is required for the transceiver not to be cracked even when the user having the transceiver in a hip-pocket of his trousers sits down on a seat in the vehicle. This required bending strength is shown as a solid line III in FIG. 3. Thus, it is required for the thickness of the transceiver to be equal to or thicker than 2 mm.

Figure 4:
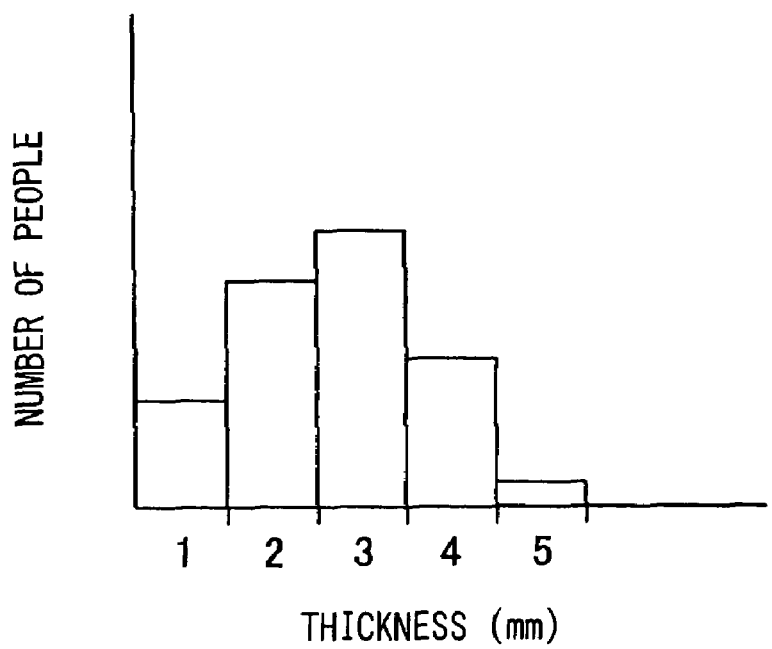
FIG. 4 is a graph showing a relationship between the thickness of the transceiver and the number of people who selects the most preferable thickness, according to the first embodiment.

Further, the portability of the transceiver having different thicknesses is tested. Specifically, the five different transceivers having the thickness in a range between 1 mm and 5 mm are manufactured. Then, a predetermined number of people as a user use and test the five different transceivers put in a pocket of trousers or in a wallet. After that, each of them decides the most preferable transceiver. FIG. 4 shows a relationship between the most preferable thickness of the transceiver and the number of people, who decide the most preferable thickness of the transceiver. As shown in FIG. 4, people decide the transceiver having the thickness of 3 mm as the most preferable transceiver in the portability. Thus, it is preferred that the thickness of the transceiver is smaller than 5 mm. Accordingly, the thickness of the resin mold 5 is preferably in a range between 2 mm and 4 mm.

As shown in FIG. 1B, the circuit board 1, the circuit part 2 and the battery holder 6 are disposed in the resin mold 5. That is, the circuit board 1, the circuit part 2 and the battery holder 6 are completely molded with the resin mold 5. Therefore, the area of a principal surface 5a of the resin mold 5 is larger than the total area of both the principal surface 1a of the circuit board 1 and a principal surface 6b of the battery holder 6. Further, the resin mold 5 covers directly on the surfaces of the circuit board 1 and the circuit part 2. Therefore, no space and no clearance is disposed between the circuit board 1 and the resin mold 5 and disposed between the circuit part 2 and the resin mold 5. However, the inside of the battery holder 6 and a battery inlet 6a of the battery holder 6 are exposed from the resin mold 5 so that the battery 4 can be inserted into the battery holder 6 through the battery inlet 6a. Further, the resin mold 5 does not mold a part of the terminal portion 3, which is disposed in the inside of the battery holder 6. The other part of the terminal portion 3, which is disposed outside of the battery holder 6, is molded with the resin mold 5. Thus, the transceiver has no hollow construction so that the transceiver becomes thinner.

The arrangement of the circuit board 1 and the battery holder 6 in the resin mold 5 can be changed as long as the battery inlet 6a of the battery holder 6 is exposed from the resin mold 5. The resin mold 5 is made of hardened resin. Specifically, the rigidity of the resin mold 5 is preferably higher than that of the circuit board 1. Accordingly, the resin mold 5 is made of, for example, thermosetting resin such as epoxy resin. Further, the resin mold 5 can be made of thermo plastic resin. In this case, it is necessary for the thermo plastic resin to heat up to about 250° C. in a process for molding the circuit board 1 with the thermo plastic resin to form the resin mold 5. Therefore, a solder layer connecting between the circuit board 1 and the circuit part 2 may melt, or resin material composing the circuit part 2 may melt. Accordingly, it is preferred that the resin mold 5 is made of thermosetting resin. A coating layer (not shown) such as a print or a coat is formed on the principal surface 5a of the resin mold 5.

The method for manufacturing the transceiver is described as follows. At first, the circuit board 1 and the battery holder 6 are prepared. Here, the circuit part 2 is mounted on the circuit board 1. Then, the circuit board 1 is inserted into the battery holder 6, as shown in FIG. 2A. In this process, the first and second terminals 3a, 3b on the circuit board 1 are inserted into the inlets 7a, 7b of the battery holder 6, respectively.

Figure 5:
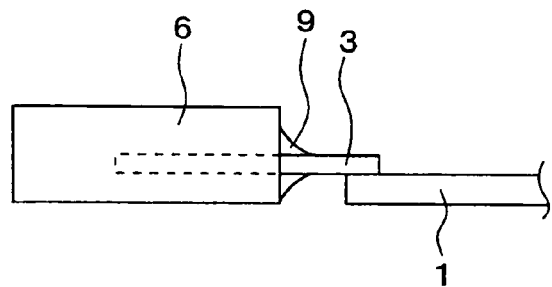
FIG. 5 is a side view showing a circuit board and a battery holder before a resin mold process, according to the first embodiment.

Then, as shown in FIG. 5, after the terminal portion 3 is inserted into the battery holder 6, the clearance between the inlet port 7 and the terminal 3 is sealed with a sealing member 9. Thus, no clearance is disposed between the inlet port 7 and the terminal 3. The sealing member 9 is made of, for example, adhesive. Thus, the inlet port 7 is sealed. This is because melted resin is prevented from penetrating in a clearance between the terminal 3 and the inlet port 7 in a resin molding process.

Figure 6:
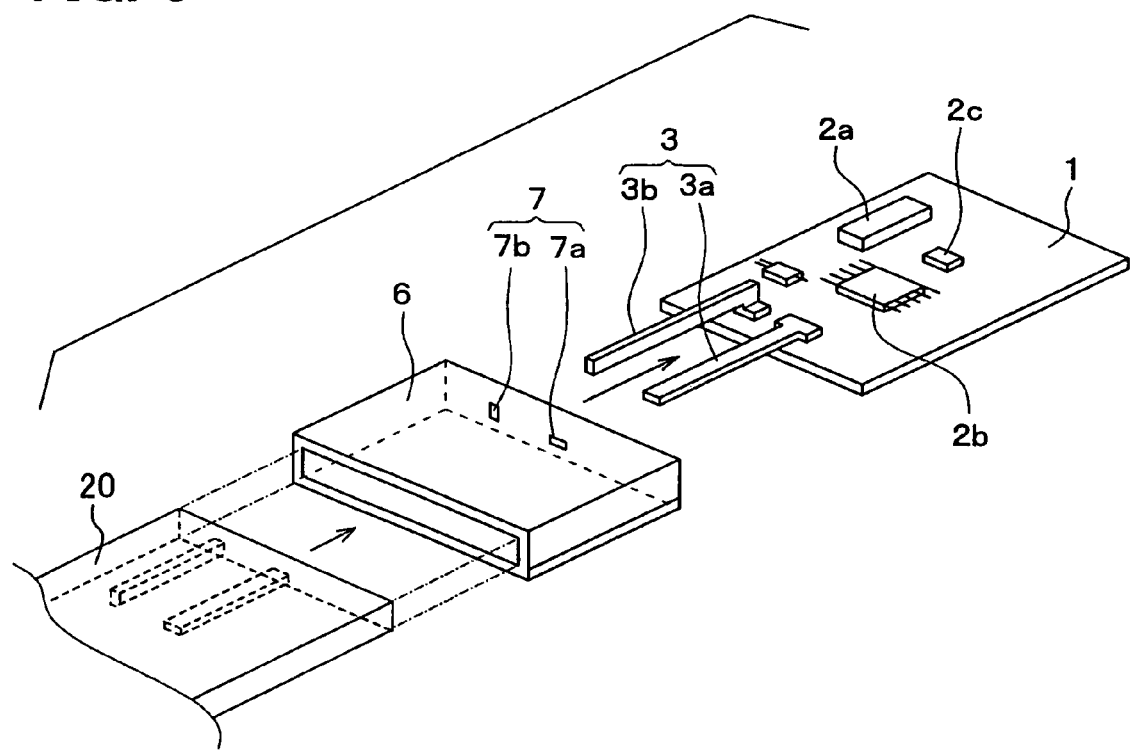
FIG. 6 is a perspective view showing the circuit board and the battery holder after the resin mold process, according to the first embodiment.

Next, the circuit part 2 and the circuit board 1 are sealed with the resin mold 5. A die having a shape of the transceiver is prepared. Then, the circuit board 1 and the battery holder 6 are put in the die. At this time, another die 20 is put in the battery holder 6 for preventing the melted resin from penetrating into the battery holder 6, as shown in FIG. 6. Then, fluidized resin material is poured in the die, and then, the material is hardened to form the resin mold 5. The method for molding the resin material is a well-known molding method such as a potting method, a transfer molding method, or an injection molding method. After the resin mold 5 is formed, the resin mold 5 with the circuit part 2 and the circuit board 1 is drawn from the die. Further, the other die 20 is also removed from the battery holder 6. In this case, since the terminal 3 has a linear shape, the other die 20 can be removed easily. Thus, the resin mold 5 having a card shape seals both of the circuit board 1 and the battery holder 6.

Figure 2B:
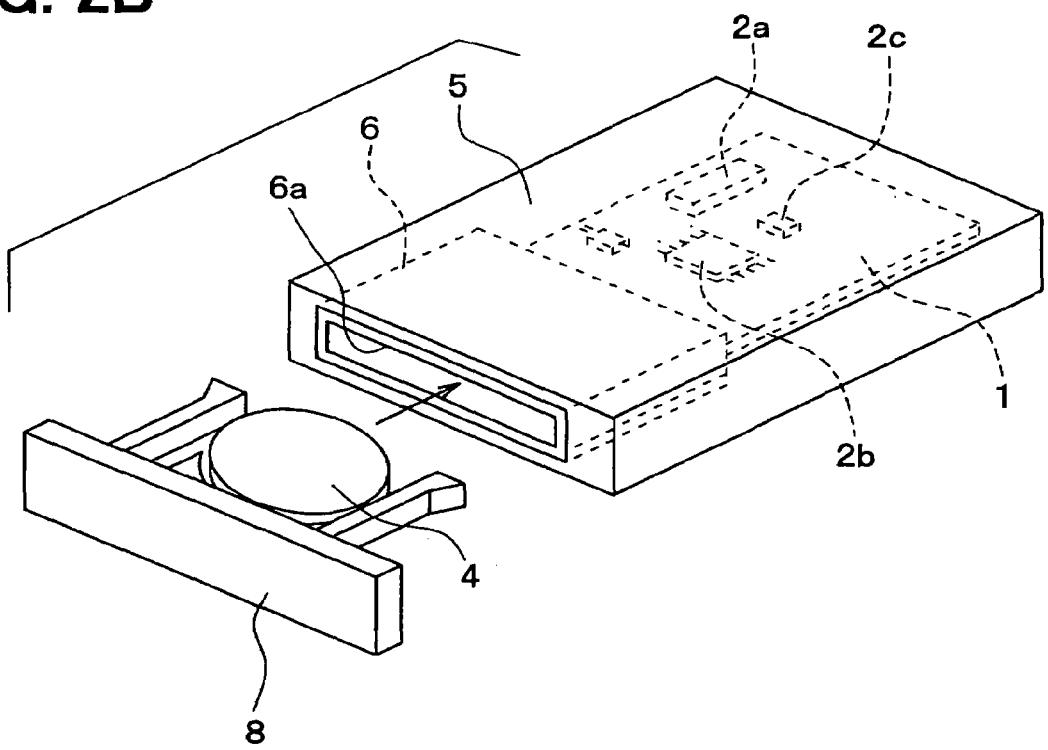

Next, a predetermined pattern is printed on the surface of the resin mold 5. Further, a coating layer is formed on the surface of the resin mold 5. After that, the battery 4 is inserted into the battery holder 6 through the battery inlet 6a, as shown in FIG. 2B. Thus, the second terminal 3b is pushed with the battery 4, and therefore, the second terminal 3b is applied to a repulsion force corresponding to the bending of the second terminal 3b by the battery 4. This repulsion force holds the second terminal 3b contacting the side surface 4c of the battery 4. Then, the battery cover 8 is mounted on the battery holder 6. Thus, the transceiver is completed.

In the transceiver, the resin mold 6 having the card shape seals and molds the circuit board 1 and the battery holder 6 completely. Further, the circuit part 2 and a part of the terminal 3 disposed outside of the battery holder 6 are covered with the resin mold 5. Accordingly, the transceiver includes no connection portion between the upper and lower casings 13a, 13b of the card type transceiver shown in FIGS. 11A and 11B so that no water penetrates into the transceiver through a clearance between the upper and lower casings 13a, 13b. Therefore, the circuit part 2 on the circuit board 1 is prevented from the water so that the transceiver has high water resistance.

Further, the circuit board 1 and the circuit part 2 are covered with the resin mold 5 directly. Therefore, the circuit part 2 is fixed on the circuit board 1 so that a relative position between the circuit part 2 and the circuit board 1 is fixed. That is, the connection portion between the circuit part 2 and the circuit board 1 is reinforced with the resin mold 5. Thus, even when the user of the transceiver drops the transceiver, the connection portion between the electronic part 2 and the circuit board 1 is not cracked by an impact.

Furthermore, the rigidity of the resin mold 5 in the solid state is higher than that of the circuit board 1. Therefore, when the user of the transceiver drops the transceiver, the circuit board 1 does not bend very much with the impact, compared with the transceiver shown in FIGS. 11A and 11B. Thus, the damage of the circuit part 2 caused by the stress applied to the circuit part 2 is reduced. Further, the damage of the stress applied to the connection portion between the circuit board 1 and the circuit part 2 is also reduced.

Thus, the transceiver has high water resistance and high impact resistance.

In the transceiver, the circuit board 1 is completely covered with the resin mold 5, and both of the circuit board 1 and the circuit part 2 directly contact the resin mold 5 so that the transceiver has no hollow construction. Accordingly, the bending strength of the circuit board 1 is increased so that the bending strength of the transceiver shown in FIGS. 1A and 1B is stronger than the comparison transceiver shown in FIGS. 11A and 11B.

Although both of the circuit board 1 and the circuit part 2 directly contact and are covered with the resin mold 5, the transceiver can have another construction, in which the both of the circuit board 1 and the circuit part 2 do not directly contact and are not covered with the resin mold 5, as long as the resin mold 5 having one integrated body seals both of the circuit board 1 and the circuit part 2 in view of the water protection.

Although the rigidity of the resin mold 5 is higher than the circuit board 1, the resin mold 5 can be made of material having the rigidity lower than the circuit board 1. Even in this case, the circuit board 1 and the circuit part 2 are sealed with the resin mold 5 completely so that the transceiver has high water resistance. Further, the connection portion between the circuit board 1 and the circuit part 2 is reinforced with the resin mold 5 so that the transceiver has high impact resistance.

Second Embodiment

Figure 7A:
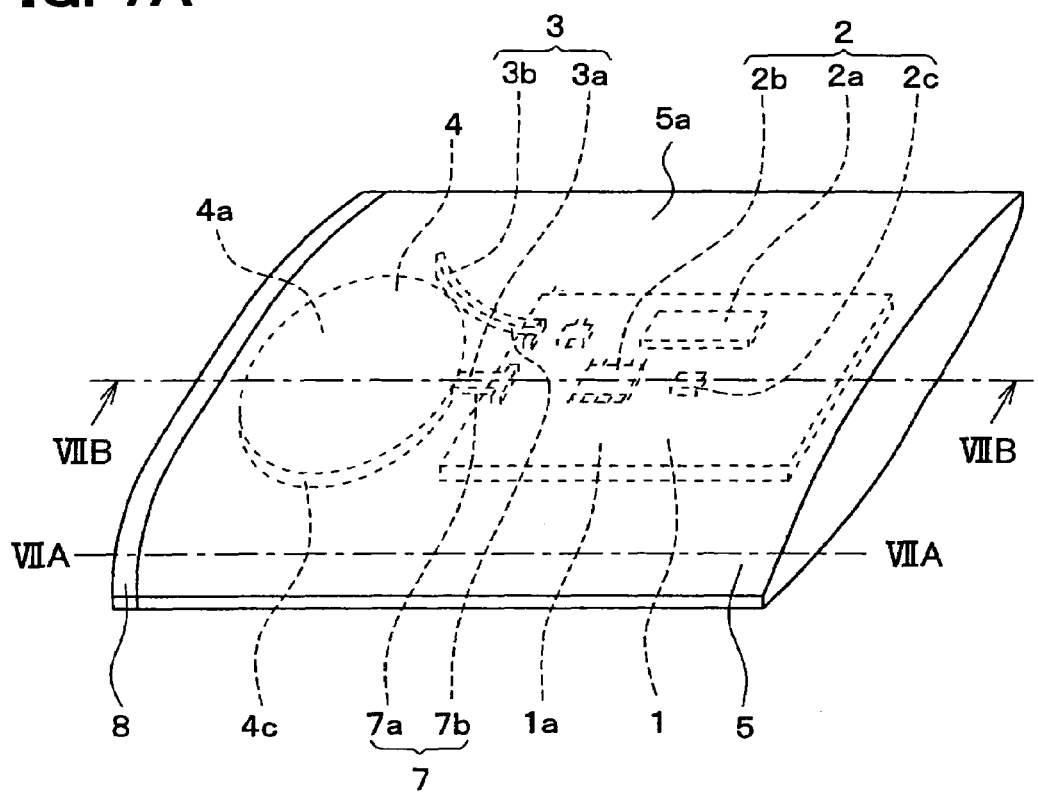
FIG. 7A is a perspective view showing a transceiver according to a second embodiment of the present invention.
Figure 7B:
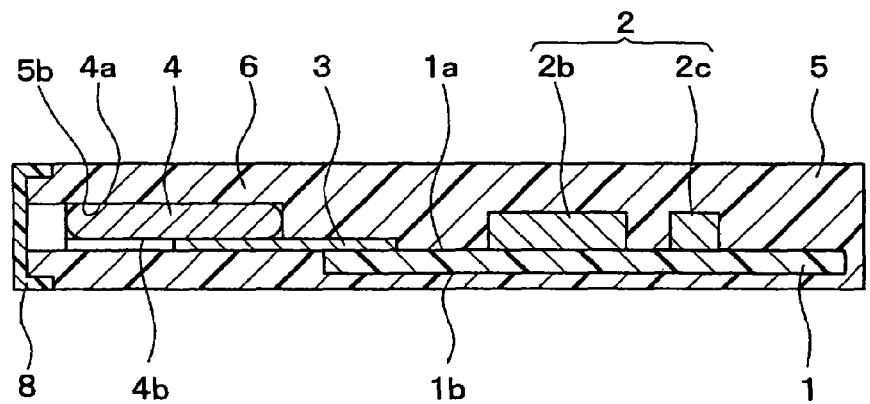
FIG. 7B is a cross sectional view showing the transceiver taken along line VIIB-VIIB in FIG. 7A.
Figure 8A:
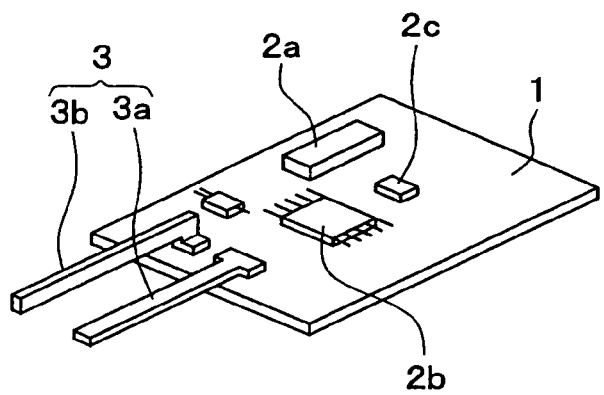
FIGS. 8A and 8B are perspective views explaining a method for manufacturing the transceiver according to the second embodiment.
Figure 8B:
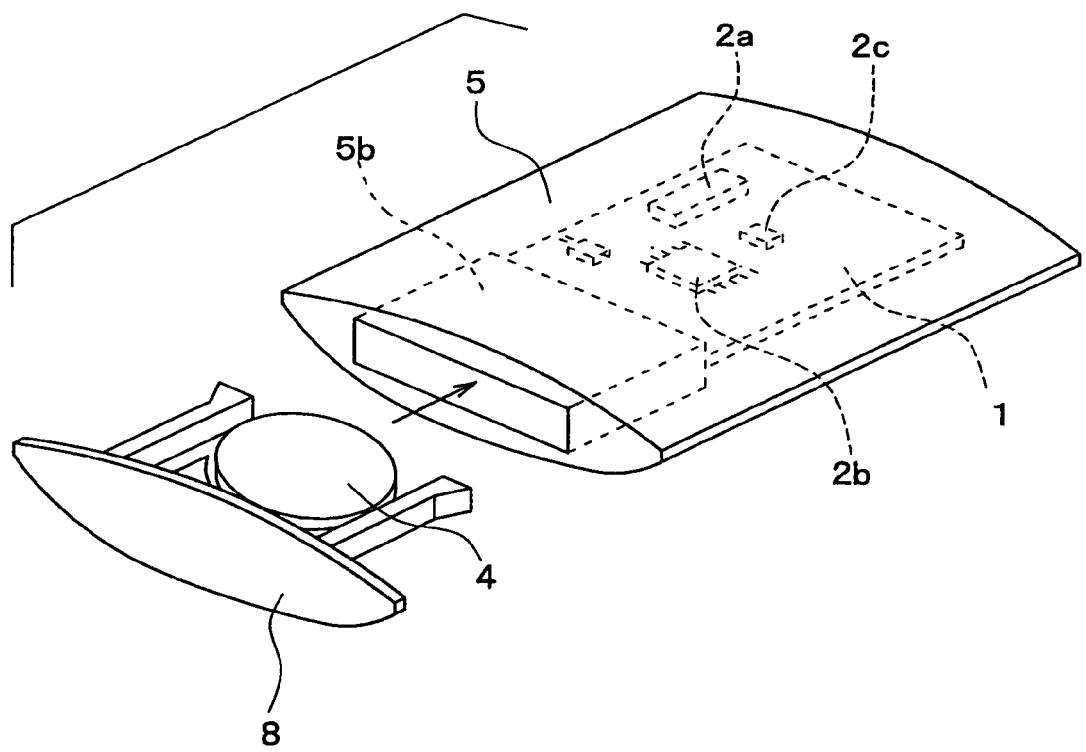

A transceiver according to a second embodiment of the present invention is shown in FIGS. 7A and 7B. Further, a method for manufacturing the transceiver is also shown in FIGS. 8A and 8B.

Although the transceiver shown in FIGS. 1A and 1B has the card type rectangular body, the transceiver in FIGS. 7A and 7B has a different shape. The resin mold 5 becomes thinner as it goes to a side of the transceiver. Therefore, a center portion of the transceiver taken along line VIIB-VIIB in FIG. 7A is the thickest portion. A side portion, for example, shown as line VIIA-VIIA is thinner than the center portion.

Since the transceiver in FIGS. 7A and 7B has the resin mold 5 with the above described shape in FIGS. 7A and 7B, the user can put the transceiver in his purse easily. Thus, the portability of the transceiver is increased. Further, the total thickness of the transceiver in FIG. 7A is thinner than that of the transceiver in FIG. 1A in a case where the maximum thickness of the transceiver in FIG. 7A taken along line VIIB-VIIB is equal to that of the transceiver in FIG. 1A. Therefore, the thickness of the transceiver in FIG. 7A seems to be thinner than the transceiver in FIG. 1A. Here, it is preferred that the maximum thickness of the transceiver is in a range between 2 mm and 4 mm. The transceiver in FIG. 7A does not include the battery holder 6. Instead, the transceiver includes a holder construction 5b in the resin mold 5, which corresponds to the battery holder 6. The transceiver can accommodate the battery 4 in the holder construction 5b of the resin mold 5.

The holder construction 5b is manufactured as follows. Firstly, as shown in FIG. 8A, the circuit board 1 is prepared. Next, the circuit board 1 is molded with resin. At this time, a die having the same shape as the inside of the battery holder 6 is used for molding the circuit board 1. After the resin is hardened, the die is removed so that the holder construction 5b as a battery holder space of the resin mold 5 is formed. Then, the battery 4 is inserted into the holder construction 5b of the resin mold 5. Then, the battery cover 8 is mounted in the holder construction 5b. Thus, the transceiver shown in FIGS. 7A and 7B is completed.

Third Embodiment

Although the circuit board 1 and the circuit part 2 is set in the die so that they are molded with the resin mold 5, they can be molded by another method.

Figure 9:
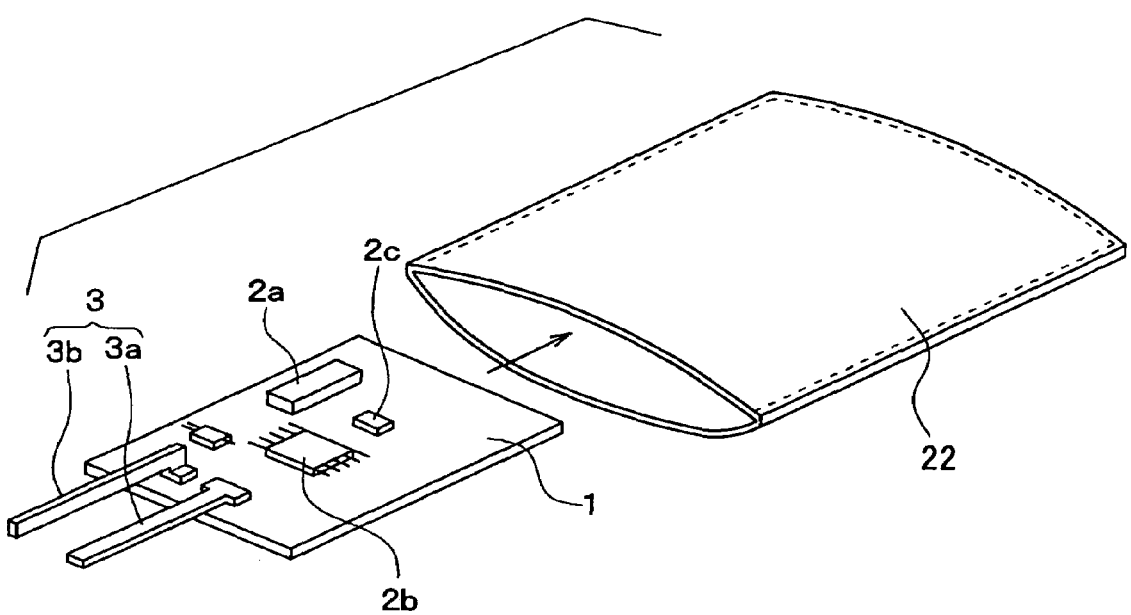
FIG. 9 is a perspective view explaining a method for manufacturing a transceiver according to a third embodiment of the present invention.

A method for manufacturing the transceiver according to a third embodiment of the present invention is shown in FIG. 9. Firstly, a thin film bag 22 is prepared. The circuit board 1 and the circuit part 2 are inserted into the bag 22. Then, the inside of the film bag 22 is molded with resin by a potting method or the like. Thus, the circuit board 1 and the circuit part 2 are sealed with the resin mold 5.

Fourth Embodiment

Figure 10A:
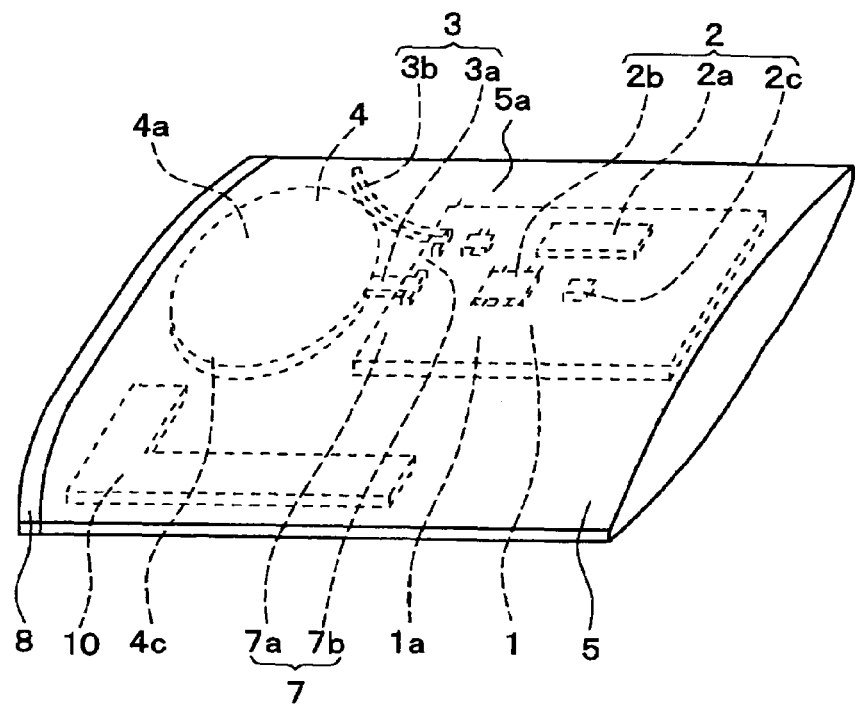
FIG. 10A is a perspective view showing a transceiver.
Figure 10B:
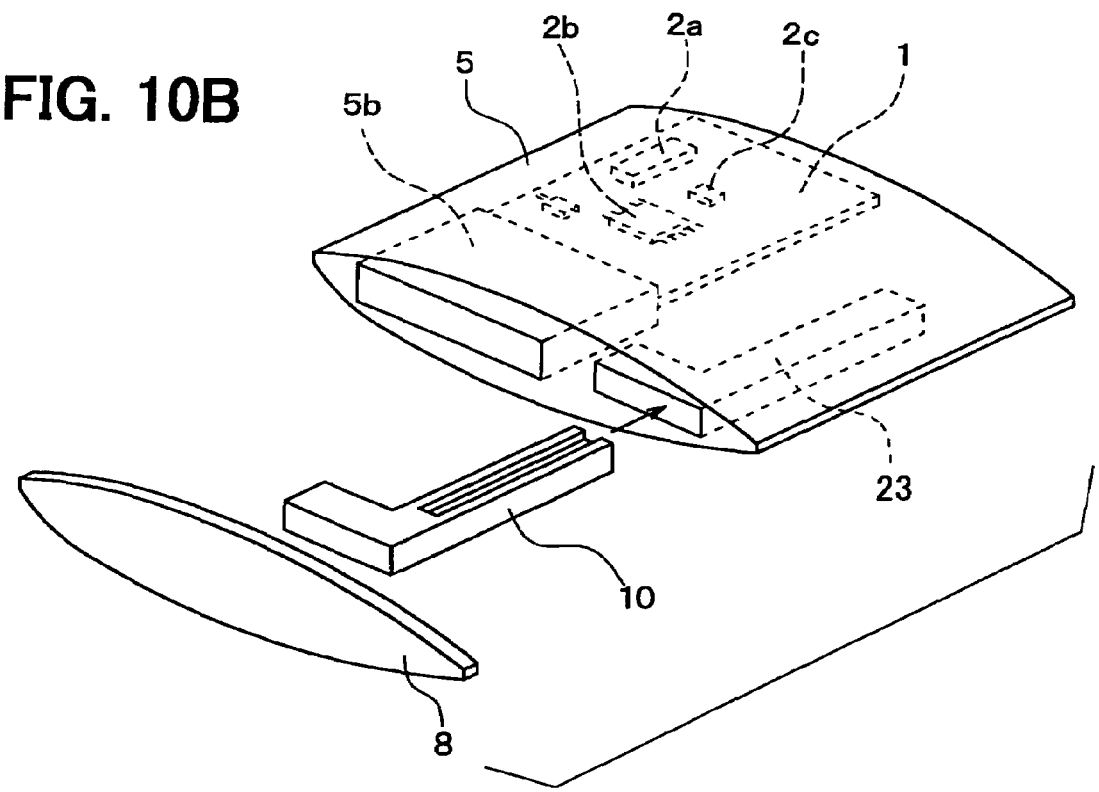
FIG. 10B is an exploded perspective view showing the transceiver according to a fourth embodiment of the present invention.

A transceiver according to a fourth embodiment of the present invention is shown in FIGS. 10A and 10B. The transceiver includes a mechanical type entry key 10. Specifically, the resin mold 5 includes an accommodation space 23 for accommodating the entry key 10. The accommodation space 23 has, for example, the same shape as the entry key 10. To provide the accommodation space 23, the circuit board 1 is disposed on one side of the resin mold 5.

In the transceiver, the entry key 10 is disposed in the accommodation space 23, and the battery cover 8 is mounted on the resin mold 5. Thus, if the battery 4 in the transceiver shuts off its power, or if the transceiver is broken, the user can use the mechanical type entry key 10 for opening a door of the vehicle and for starting an engine of the vehicle.

Such changes and modifications are to be understood as being within the scope of the present invention as defined by the appended claims.

What is claimed is:

1. A wireless transceiver for a keyless entry system of an automotive vehicle comprising:
   a circuit board having a circuit part disposed thereon; and
   a resin mold for molding the circuit board;
   a battery;
   a battery holder for accommodating the battery, and
   first and second terminals disposed on the circuit board configured to be connected to the battery,
   wherein the resin mold covers both of the circuit board and the circuit part,
   wherein the resin mold has a card shape,
   wherein the resin mold directly covers the entirety of plural surfaces of the circuit board and the entirety of plural surfaces of the circuit part,
   wherein the resin mold is made of thermosetting resin,
   wherein the battery holder is molded with the resin mold,
   wherein the battery holder has a battery inlet disposed on a side of the resin mold,
   wherein the resin mold has a rigidity higher than a rigidity of the circuit board, and
   wherein each of the first and second terminals has a linear shape, at least one of the first and second terminals being deformed by the battery.

2. The transceiver according to claim 1,
   wherein the resin mold is prepared in such a manner that the circuit board and the circuit part are mounted in a molding form, a melted resin material is inserted into the molding form, and the melding form is removed from the resin mold after the melted resin material is hardened.

3. The transceiver according to claim 1,
   wherein the resin mold has a thickness in a range between 2 mm and 4 mm.

4. The transceiver according to claim 1,
   wherein the battery includes a foreside surface, a backside surface and a side surface;
   wherein the battery has a disk shape,
   wherein the first terminal connects to the foreside or backside surface of the battery, and
   wherein the second terminal connects to the side surface of the battery.

5. The transceiver according to claim 1, further comprising:
   a sealing member,
   wherein the battery holder includes a pair of inlet ports,
   wherein a part of each terminal is embedded in the resin mold, and another part of each terminal is exposed to an inside of the battery holder through the inlet port, and
   wherein the sealing member seals a clearance between the terminal and the inlet port.

6. The transceiver according to claim 1,
   wherein the resin mold includes an accommodation space for accommodating a mechanical type entry key of the vehicle.

7. The transceiver according to claim 1,
   wherein the resin mold is provided by one integral body so that no hole is disposed on a surface of the resin mold except for the battery inlet.

8. The transceiver according to claim 7, further comprising:
   a battery cover for covering the battery inlet.

9. The transceiver according to claim 8,
   wherein the resin mold, the battery and the battery cover are configured for separating from each other.

10. The transceiver according to claim 9,
wherein the resin mold has a thickness in a range between 2 mm and 4 mm, and
wherein the resin mold has a rigidity higher than a rigidity of the circuit board.

11. The transceiver according to claim 1,
wherein the plural surfaces of the circuit board and the plural surfaces of the circuit part which the resin mold directly covers the entirety of include: an upper surface of the circuit board, a lower surface of the circuit board opposite to the upper surface of the circuit board, plural side surfaces of the circuit board, an upper surface of the circuit part, a lower surface of the circuit part opposite to the upper surface of the circuit part, and plural side surfaces of the circuit part,
wherein the resin mold is unitary and is configured to provide a continuous, uninterrupted surrounding of the entirety of the plural surfaces of the circuit board and the plural surfaces of the circuit part.

12. The transceiver according to claim 11, wherein there are at least three plural side surfaces of the circuit board which are surrounded by the resin mold,
wherein there are at least four plural side surfaces of the circuit part which are surrounded by the resin mold.

13. The transceiver according to claim 11,
wherein no hole is disposed on a surface of the resin mold except for the battery inlet.

14. The transceiver according to claim 13, further comprising:
a battery cover for covering the battery inlet.

15. The transceiver according to claim 1,
wherein the plural surfaces of the circuit board and the plural surfaces of the circuit part include: an upper surface of the circuit board being in contact with the circuit part, an upper surface of the circuit part opposite to the circuit board, a lower surface of the circuit board opposite to the upper surface of the circuit board, plural side surfaces of the circuit board, and plural side surface of the circuit part,
wherein the resin mold is disposed to be:
in continuous uninterrupted contact with an entirety of the upper surface of the circuit part, and an entirety of the plural side surfaces of the circuit part,
in continuous uninterrupted direct contact with an entirety of the lower surface of the circuit board, and an entirety of the plural side surfaces of the circuit board, and
in continuous contact with the upper surface of the circuit board.

16. The transceiver according to claim 4,
the first and second terminals being disposed to be spaced apart and to extend parallel to each other, the distance between the first and second terminals being smaller than a diameter of the battery, when in a state before the battery is inserted into the battery holder;
the first and second terminals contacting the battery electrically and the second terminal being pushed aside by the side surface of the battery, in a state when the battery is inserted into the battery holder.

17. The transceiver according to claim 1,
the first and second terminals being disposed to be spaced apart and to extend parallel to each other, when in a state before the battery is inserted into the battery holder;
the first and second terminals contacting the battery electrically and the second terminal being pushed and bent away from the first terminal by a surface of the battery, in a state when the battery is inserted into the battery holder.

18. The transceiver according to claim 1, the wireless transceiver being a portable key for the keyless entry system.

* * * * *